United States Patent
Bloomquist et al.

(10) Patent No.: US 6,661,688 B2
(45) Date of Patent: Dec. 9, 2003

(54) METHOD AND ARTICLE FOR CONCENTRATING FIELDS AT SENSE LAYERS

(75) Inventors: Darrel Bloomquist, deceased, late of Meridian, ID (US), by Judy Bloomquist, executrix; Manoj K. Bhattacharyya, Cupertino, CA (US); Thomas C. Anthony, Sunnyvale, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 120 days.

(21) Appl. No.: 10/005,423

(22) Filed: Dec. 5, 2001

(65) Prior Publication Data

US 2003/0104636 A1 Jun. 5, 2003

(51) Int. Cl.[7] ................................................. G11C 5/06
(52) U.S. Cl. .......................... 365/63; 365/33; 365/121; 365/171; 365/158; 365/145
(58) Field of Search .............................. 365/63, 33, 55, 365/121, 171, 173, 158, 145

(56) References Cited

U.S. PATENT DOCUMENTS

| | | | |
|---|---|---|---|
| 5,039,655 A | 8/1991 | Pisharody | |
| 5,956,267 A | 9/1999 | Hurst et al. | |
| 6,153,443 A | 11/2000 | Durlam et al. | |
| 6,261,893 B1 | 7/2001 | Chang et al. | |
| 6,404,674 B1 * | 6/2002 | Anthony et al. | 365/173 |
| 6,430,084 B1 * | 8/2002 | Rizzo et al. | 365/173 |
| 6,475,812 B2 * | 11/2002 | Nickel et al. | 438/3 |
| 6,510,078 B2 * | 1/2003 | Schwarzl | 365/158 |
| 6,559,511 B1 * | 5/2003 | Rizzo | 257/421 |

* cited by examiner

Primary Examiner—Michael S. Lebentritt
Assistant Examiner—Toan Le

(57) ABSTRACT

A write line structure for a magnetic memory cell includes a write conductor having a front surface facing the memory cell, a back surface and two sides surfaces. A cladding layer is disposed adjacent a portion of the front surface of the write conductor, with the cladding layer terminating at spaced first and second poles adjacent the front surface of the write conductor. A data storage layer is operatively positioned adjacent the cladding layer. The distance between the poles is less than the width of the write conductor. The width of the data storage layer may be greater than or less than the distance between the poles.

13 Claims, 9 Drawing Sheets

METHOD AND ARTICLE FOR CONCENTRATING FIELDS AT SENSE LAYERS

THE FIELD OF THE INVENTION

The present invention generally relates to magnetic random access memory (MRAM) devices. More particularly, the present invention relates to ferromagnetic cladding for concentrating a magnetic field at a sense layer.

BACKGROUND OF THE INVENTION

An MRAM device includes an array of memory cells. The typical magnetic memory cell includes a layer of magnetic film in which the magnetization is alterable and a layer of magnetic film in which the magnetization is fixed or "pinned" in a particular direction. The magnetic film having alterable magnetization may be referred to as a data storage layer or sense layer and the magnetic film which is pinned may be referred to as a reference layer.

Conductive traces (commonly referred to as word lines and bit lines) are routed across the array of memory cells. Word lines extend along rows of memory cells, and bit lines extend along columns of memory cells. Because the word lines and bit lines operate in combination to switch the orientation of magnetization of the selected memory cell (i.e., to write the memory cell) the word lines and bit lines can be collectively referred to as write lines. Additionally, the write lines can also be used to read the logic values stored in the memory cell.

Located at each intersection of a word line and a bit line is a memory cell. Each memory cell stores a bit information as an orientation of a magnetization. Typically, the orientation of magnetization in the data storage layer aligns along an axis of the data storage layer that is commonly referred to as its easy axis. External magnetic fields are applied to flip the orientation of magnetization in the data storage layer along its easy axis to either a parallel or anti-parallel orientation with respect to the orientation of magnetization in the reference layer, depending on the desired logic state (i.e., "1" or "0").

The orientation of magnetization of each memory cell will assume one of two stable orientations at any given time. These two stable orientations are referred to as parallel and anti-parallel, and represent logic values of "1" and "0". The orientation of magnetization of a selected memory cell may be changed by supplying current to a word line and a bit line which intersect at the selected memory cell. The currents create magnetic fields that, when combined, can switch the orientation of magnetization of the selected memory cell from parallel to anti-parallel or vice versa.

A selected magnetic memory cell is usually written by applying electrical currents to the particular word and bit lines that intersect the selected magnetic memory cell. An electrical current applied to the particular bit line generates a magnetic field substantially aligned along the easy axis of the selected magnetic memory cell. The magnetic field aligned to the easy axis may be referred to as a longitudinal write field. An electrical current applied to the particular word line usually generates a magnetic field substantially perpendicular to the easy axis of the selected magnetic memory cell.

Preferably, only the selected magnetic memory cell receives both the longitudinal and the perpendicular write fields. Other memory cells coupled to the particular word line preferably receive only the perpendicular write field. Other magnetic memory cells coupled to the bit line preferably receive only the longitudinal write field.

The magnitudes of the longitudinal and perpendicular write fields are usually selected to be high enough so that the chosen magnetic memory cell switches its logic state when subjected to both longitudinal and perpendicular fields, but low enough so that the other magnetic memory cells which are subject only to either the longitudinal or the perpendicular write fields do not switch. The undesirable switching of a magnetic memory cell that receives only the longitudinal or the perpendicular right field is commonly referred to as "half-select" switching.

Manufacturing variation among the magnetic memory cells often increase the likelihood of half-select switching. For example, manufacturing variations in the longitudinal or perpendicular dimensions or shapes of the memory cells may increase the likelihood of half-select switching. In addition, variation in thickness or the crystalline anisotropy of the data storage layers may increase the likelihood of half-select switching. Unfortunately, such manufacturing variations decrease the yield of manufacturing processes for magnetic memories and reduce the reliability of magnetic memories.

As with nearly every electronic device, it is desirable to reduce the size and increase the package density of MRAM devices. However, a number of factors influence the package density that can be achieved for an MRAM device. First, the size of the memory cells usually must decrease with increasing package densities. Unfortunately, reducing the size of the memory cell can result in an increase of the magnetic field that is required to switch the magnetic orientation of the memory cell.

A second factor influencing the package density of an MRAM device is the size of the write lines themselves. As with the memory cells, the dimensions of the write lines must typically decrease with increased package density. However, reducing the dimensions of the write lines results in a corresponding reduction in the current that can be carried by the write lines. A reduction in current carried by the write lines results in a weaker magnetic field at the selected memory cell and impedes the ability to write the memory cell.

A third factor which influences the package density of an MRAM device is the distance between a write line and an adjacent memory cell (e.g., a memory cell that is not the "selected" memory cell between the intersecting word and bit lines). As the distance between the write lines and adjacent memory cells decreases, the possibility increases that the magnetic field produced by a write line may inadvertently and adversely affect the information stored in an adjacent memory cell.

The problems associated with increasing the package density of an MRAM device have been addressed by others. For example, U.S. Pat. No. 5,039,655 to Pisharody discloses the use of a superconducting material around the three sides of a write line that are not adjacent to a memory cell. The superconducting material effectively shunts the magnetic field created by the current in the write line and directs the magnetic field toward the magnetic storage material of the memory cell. Similarly, U.S. Pat. No. 5,956,267 to Hurst et al., discloses a word line structure and method of manufacture therefore which improves upon the structure and construction methods of Pisharody.

One limitation of Pisharody and Hurst et al. is that the flux concentration means taught therein are restricted to three of the four sides of the write conductor. The maximum write field for a given write current is thereby limited by the width of the write conductor. A write line construction that overcomes this limitation and permits the creation of a stronger magnetic write field for a given write line width and/or a given current would be desirable.

Another limitation of Pisharody and Hurst et al. is that the flux concentration means which are formed around the write lines permit the creation of both a longitudinal component of magnetic field in the sense layer of the memory cell, as well as a perpendicular component of the magnetic field. The perpendicular component of the magnetic field is at best wasted in that it is unable to contribute to the orientation of the sense layer of the memory cell, and is perhaps harmful in that the perpendicular field may adversely affect adjacent memory cells. Thus, it would be desirable in some instances to provide a write line structure in which the longitudinal field components are reinforced and the perpendicular field components are reduced or eliminated entirely.

SUMMARY OF THE INVENTION

The present invention provides a cladded write conductor for use in a magnetic random access memory device. The cladded write conductor of the present invention permits the creation of a stronger magnetic write field for a given write line width and/or a given current.

In one embodiment, the write line structure for a magnetic memory cell comprises a write conductor having a front surface facing the memory cell, a back surface and two sides surfaces. A cladding layer is disposed adjacent a portion of the front surface of the write conductor, with the cladding layer terminating at spaced first and second poles adjacent the front surface of the write conductor. A data storage layer is operatively positioned adjacent the cladding layer. The distance between the poles is less than the width of the write conductor. The width of the data storage layer may be greater than or less than the distance between the poles.

DESCRIPTION OF THE PREFERRED EMBODIMENTS

In the following detailed description of the preferred embodiments, reference is made to the accompanying drawings which form a part hereof, and in which is shown by way of illustration specific embodiments in which the invention may be practiced. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1A:
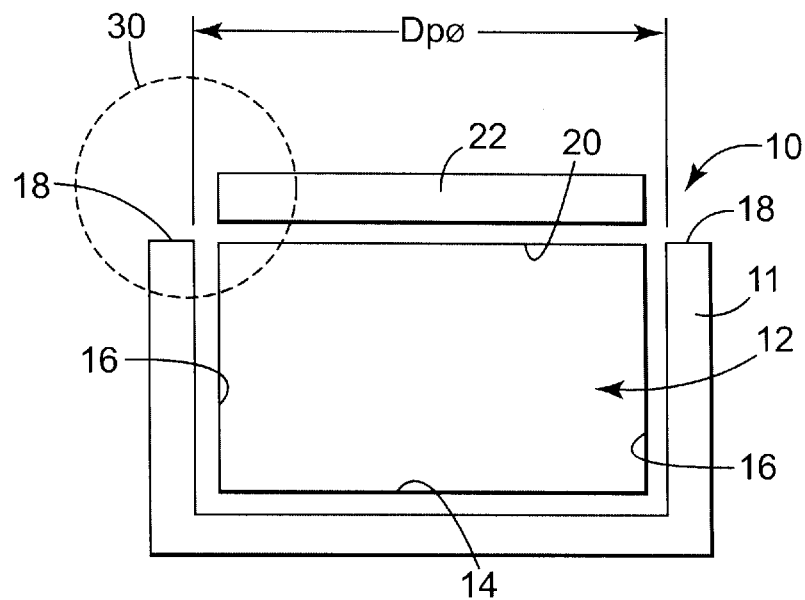
FIG. 1a is a schematic representation of a prior art magnetic field keeper.

In FIG. 1a, a prior art write line structure 10 is schematically represented. Magnetic field keeper 11 is positioned such that write line 12 is covered on its back surface 14 and side surfaces 16 by magnetic field keeper 11. The poles 18 of magnetic field keeper 11 are approximately flush with the front surface 20 of write line 12 and separated by a distance Dpo. Sense layer 22 of the magnetic memory cell is positioned adjacent the front surface 20 of write line 12, such that sense layer 22 of the memory cell is positioned above and between poles 18 of magnetic field keeper 11.

Figure 1B:
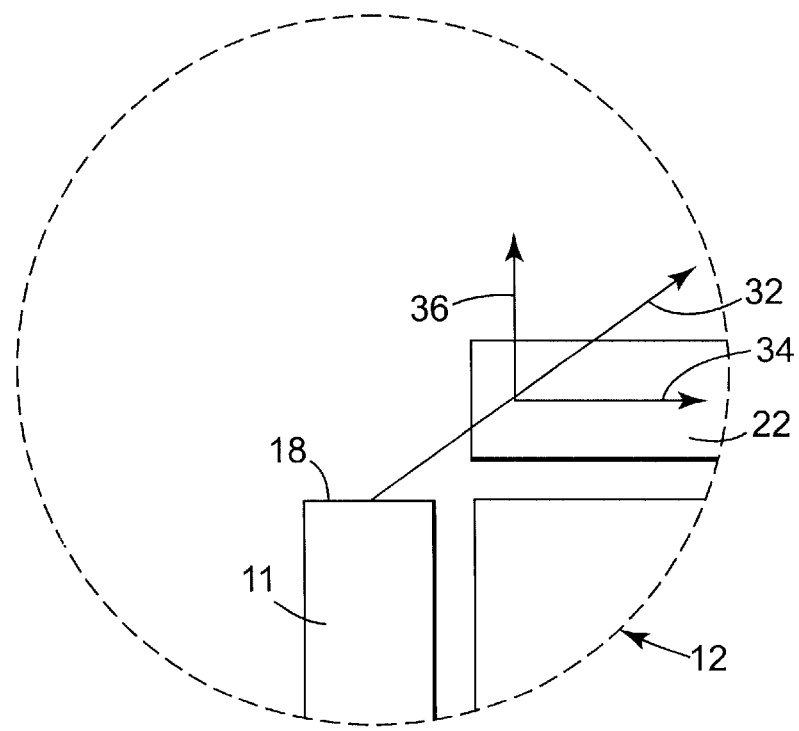
FIG. 1b is a greatly enlarged portion of the prior art magnetic field keeper of FIG. 1a illustrating the components of the magnetic field in the sense layer.

The portion of FIG. 1a enclosed by dashed circle 30 is shown greatly enlarged in FIG. 1b. The magnetic field emanating from poles 18 of magnetic field keeper 11 is represented by vector 32. As illustrated, magnetic field vector 32 includes both a longitudinal component 34 and a perpendicular component 36. The longitudinal component 34 is directed along the easy axis of the sense layer 22 and contributes to the switching of the magnetization in the sense layer 22. Because the strength of the magnetic write field is inversely proportional to the distance $D_{P0}$ between poles 18, for a given current the strength of the write field is limited by the width of the write line 12. The prior art structure 10 is thus limited in its ability to compensate forever decreasing memory cell sizes and the need for a stronger write field from the word lines.

The present invention utilizes a novel cladding structure about the write line conductors to decrease the distance between the poles of the flux concentration means, and thereby produce a greater write field for a given current and write line width. The present invention is not limited by the width of the write line, as in the prior art.

Figure 2A:
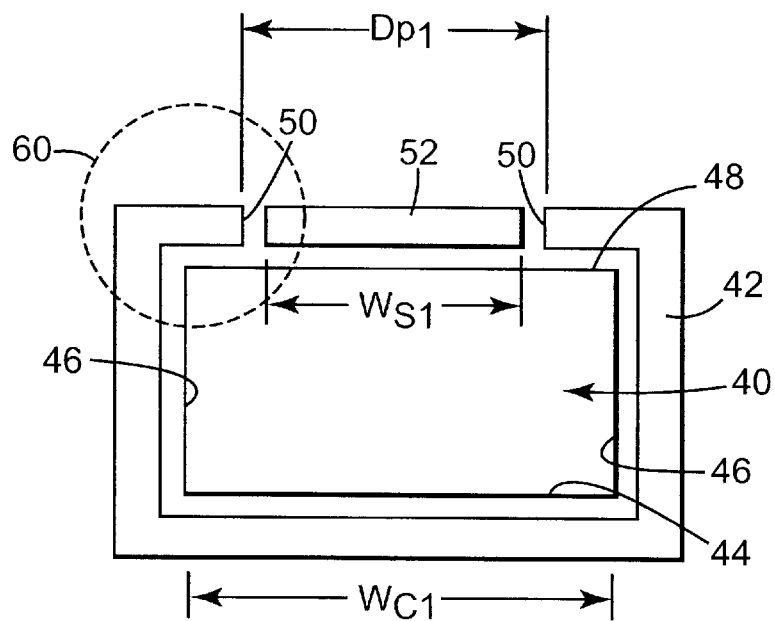
FIG. 2a is a schematic representation of an embodiment of the cladded write conductor of the present invention.

FIG. 2a shows one embodiment of the present invention in which a write conductor 40 having a width $W_{C1}$ is surrounded by cladding 42 on its back surface 44, side surfaces 46, and a portion of its front surface 48. Cladding 42 terminates at poles 50 which are positioned along front surface 48 and away from side surfaces 46. Poles 50 are spaced from each other by a distance $D_{P1}$ which is less than $W_{C1}$. The sense layer 52 of the magnetic memory cell has a width $W_{S1}$ which is less than $D_{P1}$ and is positioned directly between poles 50. As discussed below with respect to FIGS. 3a and 3b, the sense layer 52 may also have a width greater than $D_{P1}$.

Figure 2B:
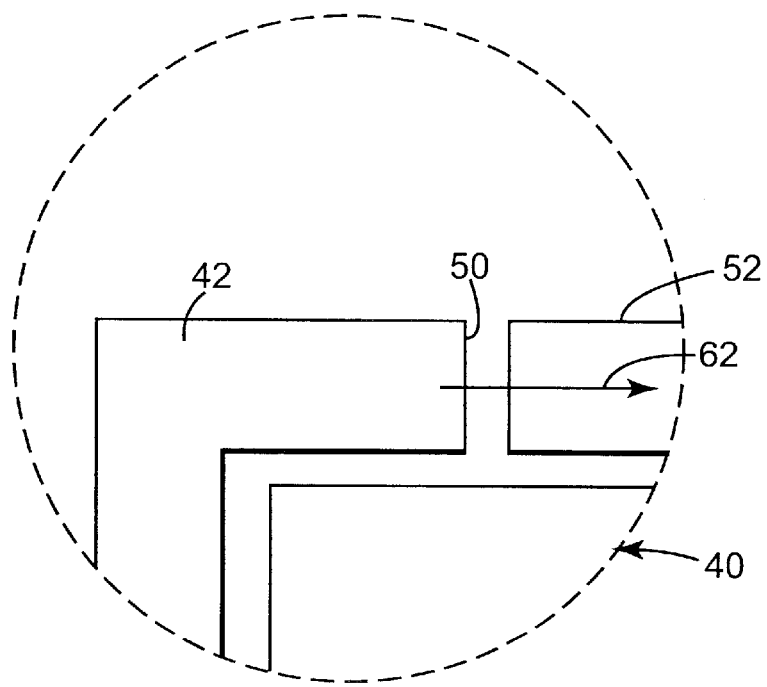
FIG. 2b is a greatly enlarged portion of the cladded write conductor of FIG. 2a illustrating the components of the magnetic field in the sense layer.

The portion of FIG. 2a enclosed by circle 60 is shown in FIG. 2b. The magnetic field emanating from poles 50 of cladding 42 is represented by vector 62. As illustrated, magnetic field vector 62 has only a longitudinal component and no perpendicular component. Thus, in the embodiment of FIGS. 2a and 2b the entire magnetic field generated by write conductor 40 is utilized to switch the orientation of magnetization of sense layer 52.

The construction as shown in FIGS. 2a and 2b provides multiple advantages over the prior art. First, poles 50 are positioned closer to each other than allowed by prior art devices. That is, $D_{P1}$ is less than $W_{C1}$. This allows a stronger write field to be created for a given current and write line width. Second, because sense layer 52 is positioned directly between poles 50, there is no significant perpendicular component of the magnetic field. Rather, the entire magnetic field is directed in the longitudinal direction. Thus, a stronger magnetic field may be formed in the sense layer 52 for a given current in write line 40. Alternately, a lower current may be provided in write line 40 for a desired magnetic field strength.

Figure 3A:
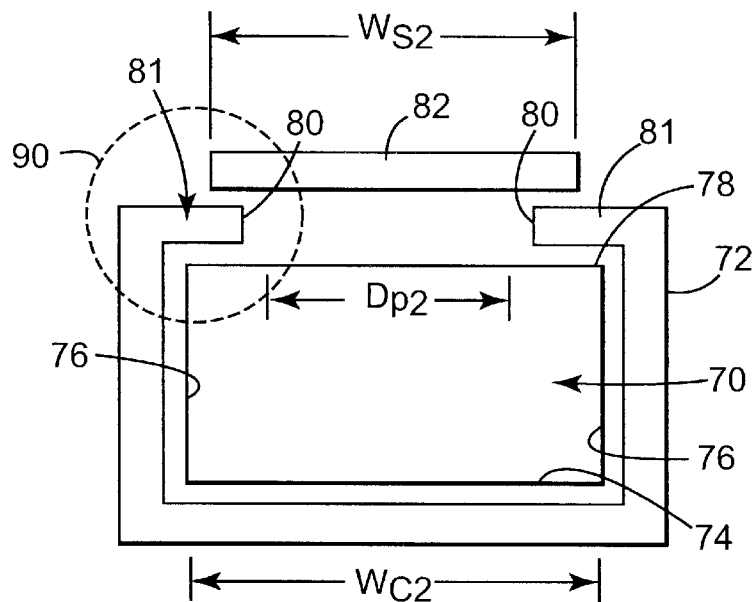
FIG. 3a is a schematic representation of another embodiment of the cladded write conductor of the present invention.

FIG. 3a shows another embodiment of the present invention in which a write conductor 70 having a width $W_{C2}$ is surrounded by cladding 72 on its back surface 74, side surfaces 76, and a portion of its front surface 78. Cladding 72 terminates at poles 80 which are positioned adjacent to the front surface 78 and away from the side surfaces 76. Poles 80 are spaced from each other by a distance $D_{P2}$ which is less than the width $W_{C2}$ of the conductor 70. This confers the advantage that the poles 80 are positioned closer to each other than allowed by prior art devices (i.e., the distance between poles 80 is less than the width of the write line 70), thereby allowing a stronger write field to be created for a given current and write line width. In this embodiment, a sense layer 82 having a width $W_{S2}$ is positioned above the poles 80, such that poles 80 are positioned between front surface 78 and sense layer 82. Width $W_{S2}$ of sense layer 82 is greater than the spacing $D_{P2}$ between poles 80, which is important for reasons elaborated upon below.

Figure 3B:
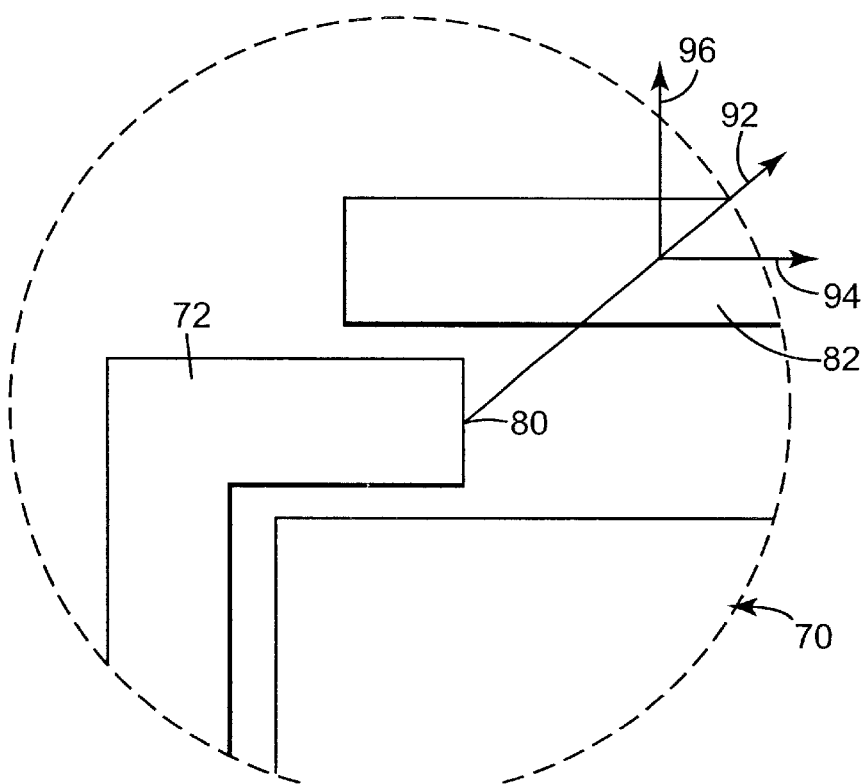
FIG. 3b is a greatly enlarged portion of the cladded write conductor of FIG. 3a illustrating the components of the magnetic field in the sense layer.

The portion of FIG. 3a enclosed by circle 90 is shown greatly enlarged in FIG. 3b. The magnetic field emanating from poles 80 of cladding 72 is represented by vector 92. The magnetic field vector 92 has both a longitudinal component 94 and a perpendicular component 96, as in the prior art devices discussed above. However, the construction of FIGS. 3a and 3b has the advantage over the prior art devices in that a higher magnitude magnetic field will be created in a narrower region of sense layer 82. That is, the construction shown in FIGS. 3a and 3b mimics the effect of write conductor 70 being narrower than sense layer 82, without $W_{C2}$ actually being less than $W_{S2}$.

The benefits of write conductors being smaller in dimension than the sense layer of the memory cell are described in U.S. Pat. No. 6,236,590 to Bhattacharyya et al., which is herein incorporated by reference. Specifically, the advantages of the write conductors having dimensions smaller than the dimensions of the sense layer include but are not limited to: improved coupling of a write magnetic field with the sense layer so that the write magnetic field is not wasted or reduced due to misalignments between the sense layer and the write conductor; reduced possibility of misalignments between the write conductors and the sense layers; elimination or reduction of leakage magnetic fields that may interfere with adjacent memory cells; an increase in the magnitude of the magnetic field for a given current; and the ability to generate a magnetic field necessary to rotate the orientation of magnetization of the sense layer with a reduced magnitude of current, thereby reducing power consumption by the MRAM device.

The embodiment of the invention shown in FIGS. 3a and 3b provides all of the advantages enumerated above, without requiring an actual reduction in size of the write conductor. The ability to mimic the effects of the write conductor being narrower than the sense layer, without actually reducing the dimensions of the write conductor or increasing the size of the sense layer, is advantageous for several reasons. First, manufacturing write conductors of ever decreasing size becomes increasingly difficult and expensive. Second, decreasing the size of the write conductors may introduce undesirable consequences which the offset the benefits of the write conductors being smaller in dimension than the sense layers. Specifically, reducing the dimensions of the write conductor results in a corresponding increase in resistance of the conductor. The increased resistance of the write conductor introduces the need for a higher voltage source to drive the current through the write conductor. Also, a higher resistance in the write conductor increases the amount of heat generated by the MRAM device, which may prove difficult to dissipate. Decreasing the area of the write conductor also increases the current density in the write conductor, which may lead to undesirable electromigration.

Figure 4:
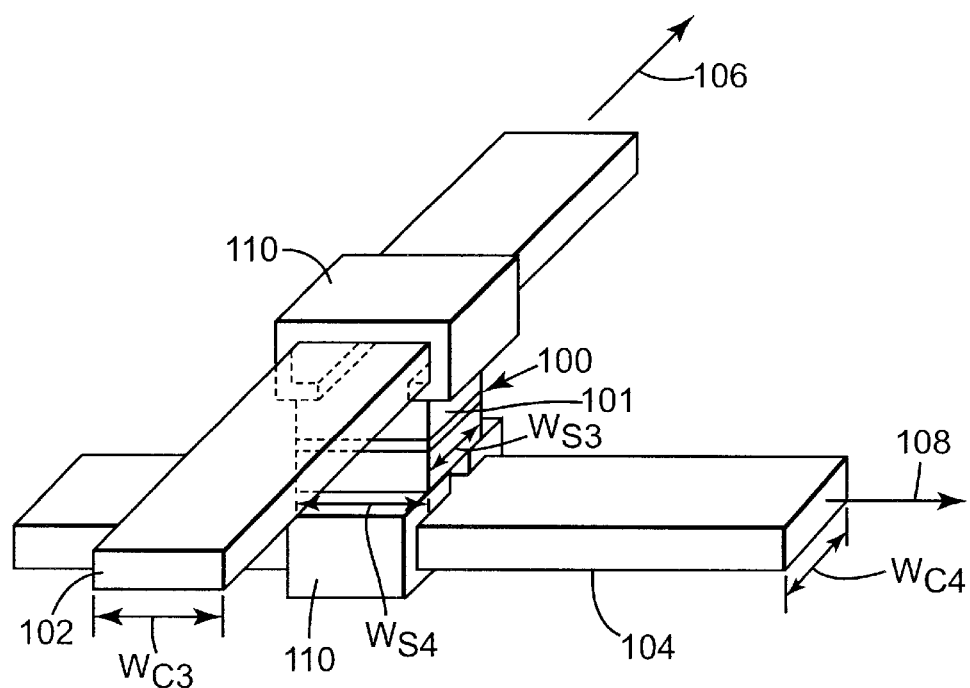
FIG. 4 is a perspective view of an MRAM device using the present invention.

Although the examples of the present invention as shown in FIGS. 2a, 2b, 3a and 3b illustrate only a single write conductor (that is, only the word line or the bit line), it will readily be recognized by those skilled in the art that the principles discussed above may advantageously be used with both word lines and bit lines in a magnetic random access memory, either in combination or alone. As shown in FIG. 4, a magnetic memory cell 100 having a data storage layer 101 is positioned between a first conductor 102 and a second conductor 104. The first conductor 102 has a width $W_{C3}$ and extends in a first direction 106, and the second conductor 104 has a width $W_{C4}$ and extends in a second direction 108. In a preferred embodiment, the first and second directions 106, 108 are generally orthogonal to each other. However, the invention described herein is equally applicable when the first and second directions 106, 108 are not orthogonal. The data storage layer 101 has a first layer width $W_{S3}$ in the first direction 106, and a second layer width $W_{S4}$ in the second direction 108. The data storage layer 101 has an easy axis which is generally aligned with the second direction 108. It will be noted that in FIG. 4, data storage layer 101 and cladding 110 are positioned about first and second conductors 102, 104 as exemplified above in FIGS. 3a and 3b. However, data storage layer 101 and cladding 110 may alternately be configured as described above with respect to FIGS. 2a and 2b.

In all of the examples given above, cladding 42, 72, 110 preferably is comprised of high permeability ferromagnetic materials. Examples of preferred cladding material alloys are NiFe, CoFe, Co, Fe, FeN, and amorphous Co-based alloys (CoZrNb, CoTaNb, CoHfNb). Those skilled in the art will recognize that other materials may also be suitable for the purposes intended. The cladding materials forming the pole extensions on the front surface of the write conductors need not be the same as the cladding materials on the other three sides of the conductor. The thickness of the cladding layers is preferably in the range of 1 to 50 nm, and more preferably in the range of 5–15 nm.

Figure 5A:
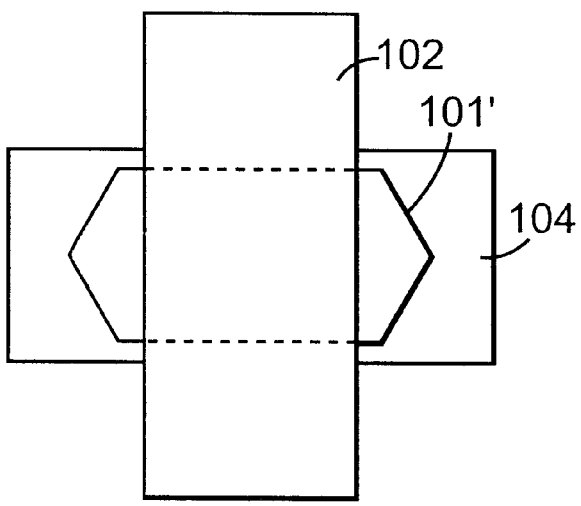
FIGS. 5a and 5b illustrate alternate sense layer shapes.
Figure 5B:
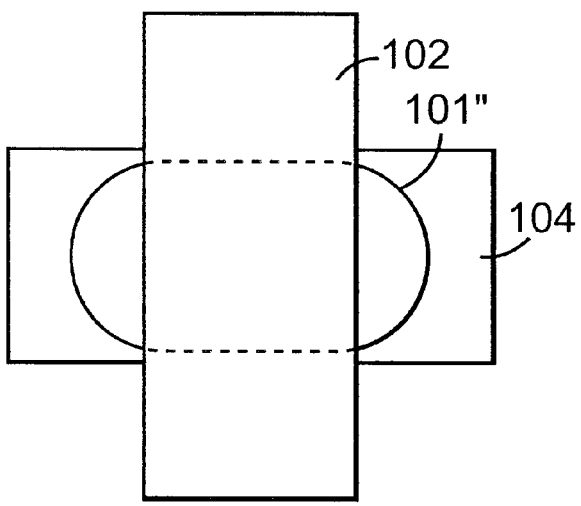
Figure 6A:
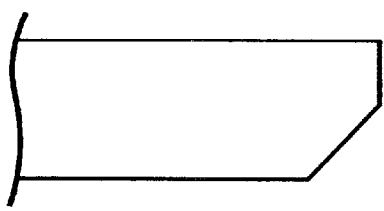
FIGS. 6a–6d illustrate possible pole designs for the present invention.
Figure 6B:
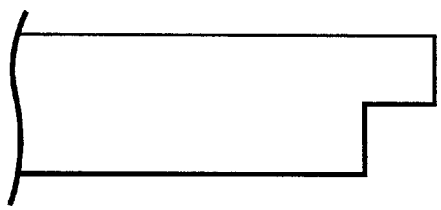
Figure 6C:
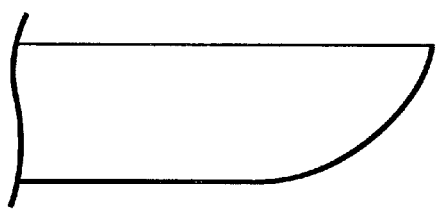
Figure 6D:
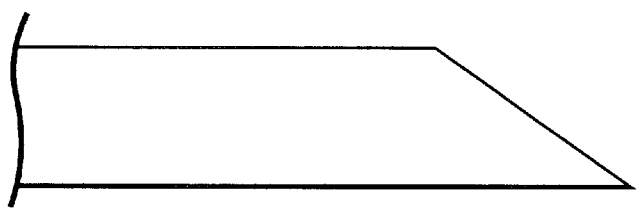

The sense layers 52, 82, 101 described above can be magnetoelectric devices that include but are not limited to spin dependent tunneling devices, spin valve devices, and giant magnetoresistive devices. Further, although the sense layers 52, 82, 101 are illustrated heretofore as having rectangular shapes, the sense layers 52, 82, 101 may have shapes that include but are not limited to a rectangular shape, a polygon shape 101', and an arcuate shape 101", as illustrated in FIGS. 5a and 5b, respectively.

The design of the poles 50, 80 may be selected so as to maximize the magnetic field for a given current. Examples of preferred pole designs are shown in FIGS. 6a–6d, by way of the example only. Each of the illustrated pole designs act to sharpen the edge of the poles so as to more highly concentrated the magnetic field emanating from the poles. Those skilled in the art will recognize a multitude of additional pole shapes which will also serve for the intended purpose.

The embodiments described in this invention may be fabricated by those skilled in the art using known methods of deposition, lithography, etch and planarization common to semiconductor manufacturing.

It is recognized that one implementation of this invention may require patterned features with lateral dimensions less than the minimum feature size λ allowed by the lithography system. Referring to FIG. 3a, for example, the distance $D_{P2}$ may be less than λ. A process for generating the gap between the poles of the cladding at sub-λ dimensions is described below with reference to FIGS. 7a–7g.

Figure 7A:
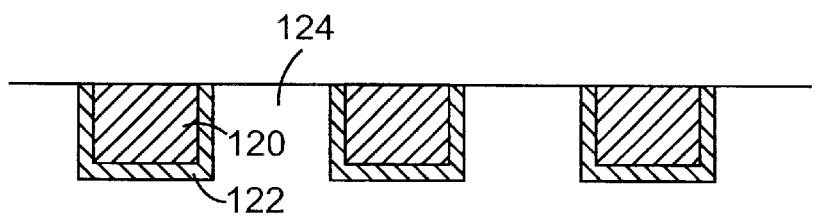
FIGS. 7a–7g illustrate a process for forming one embodiment of the cladded write conductor of the present invention.
Figure 7B:
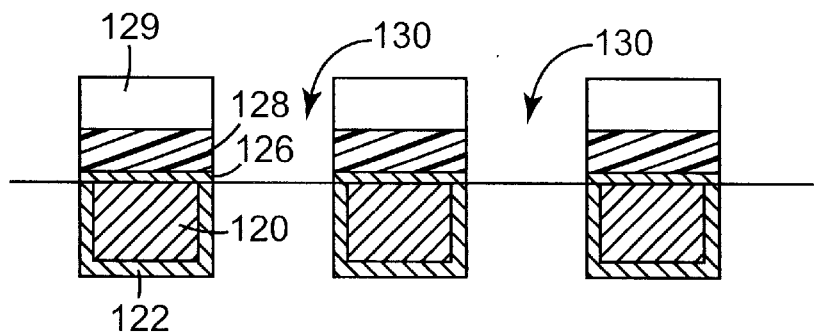
Figure 7C:
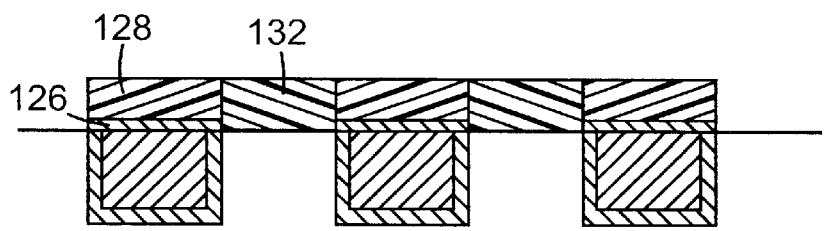
Figure 7D:
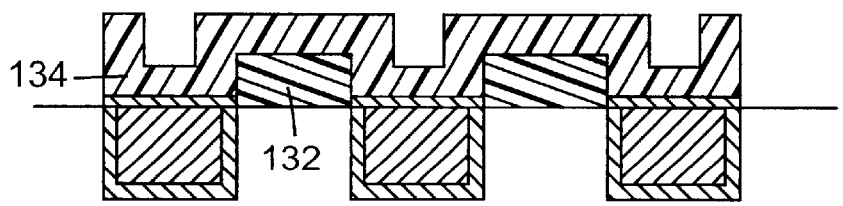
Figure 7E:
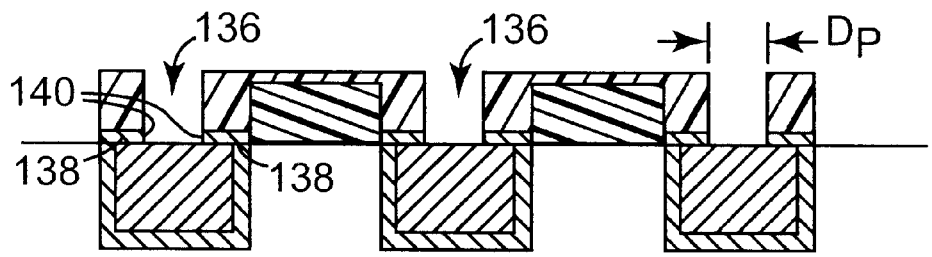
Figure 7F:
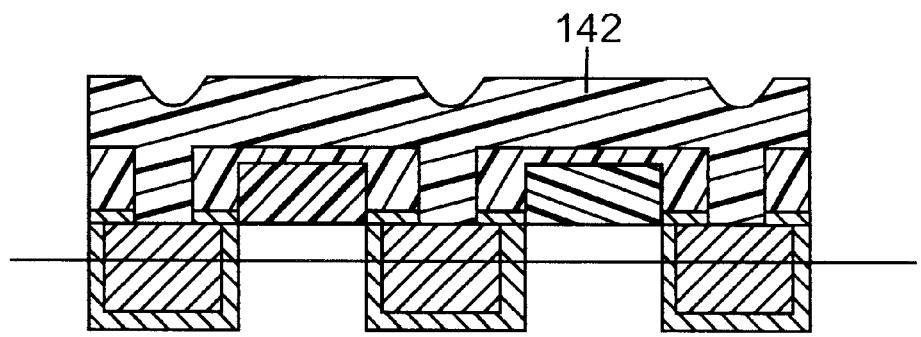

First, an assembly of planarized conductors 120 having cladding 122 is fabricated within a matrix of dielectric 124, as shown in FIG. 7a. Damascene processing may be employed to create such conductors. Cladding 122 preferably includes a layer of ferromagnetic material, and may also include a barrier layer between the layer of ferromagnetic material and the conductor 120. Next, a layer of ferromagnetic material 126 that will serve as pole extensions is deposited, followed by a dielectric layer 128. Photolithographic and etch processes are used to remove both the dielectric and ferromagnetic layers 128, 126, respectively, in regions 130 (defined by photoresist 129) between the cladded conductors 120, as shown in FIG. 7b. A second dielectric layer 132 is deposited over the patterned films, and the two dielectric layers 128, 132 are then planarized to form the structure of FIG. 7c. Preferential etching of the first dielectric 128 leaves the second dielectric 132 between the conductors 120. Conformal deposition of a third dielectric 134 creates the topography illustrated in FIG. 7d. Exposing this structure to a highly anisotropic etch removes dielectric only in the vertical dimension, allowing a narrow via 136 to be formed down to the ferromagnetic material 126. At this point the ferromagnetic material 126 is etched to create the pole extensions 138 and gap $D_P$ between the poles 140, which can be less than λ (refer to FIG. 7e).

Figure 7G:
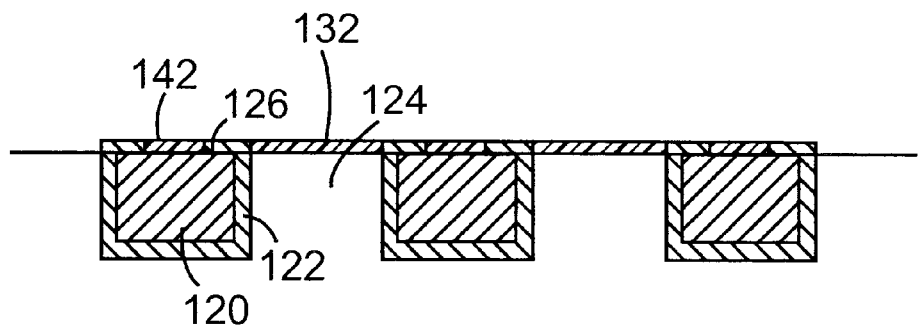
Figure 8:
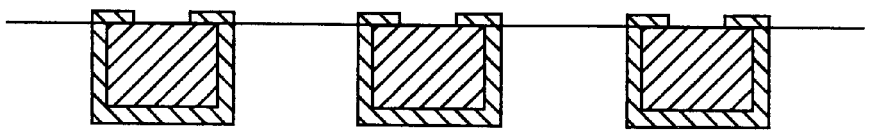
FIG. 8 illustrates an alternate process step for forming a different construction of the cladded write conductor of the present invention.

If a planarized surface is desired, a fourth dielectric layer 142 is deposited to fill the via 136 regions (FIG. 7f) and then planarized (FIG. 7g). Alternatively, the dielectric films remaining after step 7e can be etched to create the cladded conductors of FIG. 8. Traditional deposition and patterning methods can then be employed to create the memory cell on top of these structures.

Referring to FIG. 3A, the magnetic sense layer 82 in the memory cell can be either in direct contact with the pole extensions 81, or physically separated from the pole extensions by an intervening layer. Additionally, it is not a requirement that the pole extensions 81 be planarized, as indicated in FIG. 7g, prior to deposition of the memory cell or sense layer.

Figure 9:
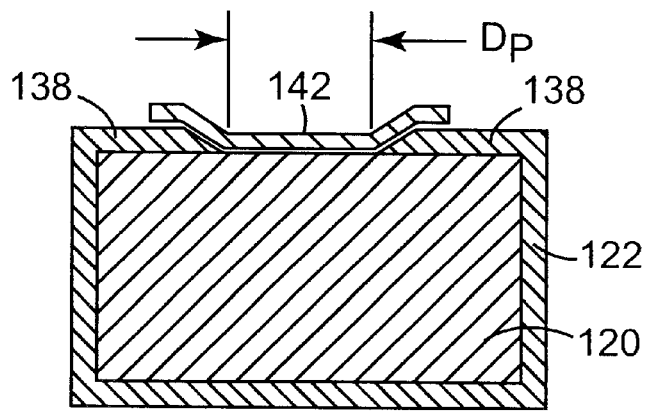
FIG. 9 illustrates a memory cell traversing a cladded write conductor having non-planarized pole extensions.

The thickness of the pole extensions may be as little as 1 nm, is preferably on the order of 1 to 50 nm, and more preferably on the order of 5 to 15 nm. A memory cell 142 traversing non-planarized pole extensions 138 is shown in FIG. 9. It is also noted that neither the memory cell 142 (including the sense layer) nor the gap $D_P$ between the pole extensions 138 have to be centered above the conductor material.

Although specific embodiments have been illustrated and described herein for purposes of description of the preferred embodiment, it will be appreciated by those of ordinary skill in the art that a wide variety of alternate and/or equivalent implementations may be substituted for the specific embodiments shown and described without departing from the scope of the present invention. Those with skill in the electromechanical and electrical arts will readily appreciate that the present invention may be implemented in a very wide variety of embodiments. This application is intended to cover any adaptations or variations of the preferred embodiments discussed herein. Therefore, it is manifestly intended that this invention be limited only by the claims and the equivalents thereof.

What is claimed is:

1. A write line structure for a magnetic memory device having a magnetic field sensitive memory cell, comprising:

a write conductor having a front surface adjacent the memory cell, a back surface and two sides surfaces;

a cladding layer adjacent the back surface, the two sides surfaces and a portion of the front surface of the write conductor, the cladding layer including a layer of magnetic material, wherein the cladding layer adjacent the front surface of the write conductor forms two pole pieces adjacent to the front of the wire conductor, and wherein the pole pieces are positioned between the front surface of the wire conductor and the magnetic memory cell.

2. The write line structure of claim 1, wherein the magnetic memory cell has a width greater than the spacing between the pole pieces.

3. The write line structure of claim 2, wherein the magnetic memory cell is spaced from the pole pieces.

4. The write line structure of claim 2, wherein the magnetic memory cell is in contact with the pole pieces.

5. A write line structure for a magnetic memory cell, comprising:

a write conductor having a front surface facing the memory cell, a back surface and two sides surfaces, the write conductor having a first width;

a cladding layer disposed adjacent a portion of the front surface of the write conductor, the cladding layer terminating at first and second poles adjacent the front surface of the write conductor, the first and second poles separated from each other by a second width; and a data storage layer operatively positioned adjacent the cladding layer, the data storage layer having a third width;

wherein the second width is less than the first width and wherein the second width is less than the third width.

6. A write line structure for a magnetic memory cell, comprising:

a write conductor having a front surface facing the memory cell, a back surface and two sides surfaces, the write conductor having a first width;

a cladding layer disposed adjacent a portion of the front surface of the write conductor, the cladding layer terminating at first and second poles adjacent the front surface of the write conductor, the first and second poles separated from each other by a second width; and a data storage layer operatively positioned adjacent the cladding layer, the data storage layer having a third width;

wherein the second width is less than the first width; and wherein the poles are tapered.

7. A write conductor layout structure for a magnetic memory cell, comprising:
- a first conductor having a first width;
- a second conductor having a second width;
- a data storage layer operatively positioned between the first conductor and the second conductor and having a first layer width in a first direction and a second layer width in a second direction, the first and second conductors crossing the data storage layer in substantially the first and second directions, respectively;
- a first cladding layer disposed about the first conductor and terminating at a first set of poles between the first conductor and the data storage layer, the first set of poles separated by a first spacing; and
- a second cladding layer disposed about the second conductor and terminating at a second set of poles between the second conductor and the data storage layer, the second set of poles separated by a second spacing;
- wherein the first spacing between the first set of poles is less than the first width of the first conductor and is less than the second layer width of the data storage layer.

8. The write conductor layout structure of claim 7, wherein the second spacing between the second set of poles is less than the second width of the second conductor and is less than the first layer width of the data storage layer.

9. The write conductor layout structure of claim 7, wherein a selected one of the first direction or the second direction is co-linear with an easy axis of the data storage layer.

10. The write conductor layout structure of claim 7, wherein the data storage layer is a magnetoelectric device selected from the group consisting of a spin dependent tunneling device, a spin valve device, and a giant magnetoresistive device.

11. The write conductor layout structure of claim 7, wherein the first and second directions are substantially orthogonal to each other such that the first conductor and the second conductor cross the data storage layer in substantially orthogonal relation to each other.

12. A method for concentrating a magnetic field in a sense layer of a magnetic memory cell, comprising:
- forming a cladding layer on a write conductor having a front surface, a back surface and two sides surfaces, the cladding including a layer of magnetic material disposed adjacent the back, side and front surfaces of the write conductor, the cladding layer terminating at first and second poles adjacent the front surface of the write conductor; and
- placing a data storage layer adjacent the first and second poles of the cladding,
- wherein the first and second poles are positioned between the front surface of the write conductor and the data storage layer.

13. The method of claim 12, wherein the poles are separated from each other by a distance less than a width of the data storage layer.

\* \* \* \* \*